(12) United States Patent
Fuderer

(10) Patent No.: US 9,482,733 B2
(45) Date of Patent: Nov. 1, 2016

(54) MAGNETIC RESONANCE ELASTOGRAPHY

(75) Inventor: Miha Fuderer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1104 days.

(21) Appl. No.: 13/513,918

(22) PCT Filed: Dec. 20, 2010

(86) PCT No.: PCT/IB2010/055950
§ 371 (c)(1),
(2), (4) Date: Jun. 5, 2012

(87) PCT Pub. No.: WO2011/077355
PCT Pub. Date: Jun. 30, 2011

(65) Prior Publication Data
US 2012/0289814 A1    Nov. 15, 2012

(30) Foreign Application Priority Data

Dec. 21, 2009    (EP) .................................... 09180122

(51) Int. Cl.
*G01V 3/00*    (2006.01)
*G01R 33/563*  (2006.01)
(52) U.S. Cl.
CPC .............. *G01R 33/56358* (2013.01)
(58) Field of Classification Search
CPC .. G01R 33/56358; A61B 5/05; A61B 5/055; A61B 5/0048
See application file for complete search history.

(56) References Cited

U.S. PATENT DOCUMENTS

| 5,592,085 | A  |   | 1/1997  | Ehman |
| 6,486,669 | B1 | * | 11/2002 | Sinkus et al. ................. 324/307 |
| 6,879,155 | B2 |   | 4/2005  | Ehman et al. |
| 7,259,558 | B2 |   | 8/2007  | Bieri et al. |
| 7,439,736 | B2 |   | 10/2008 | Meaney et al. |
| 2011/0006767 | A1 | * | 1/2011 | Sack et al. .................... 324/309 |

FOREIGN PATENT DOCUMENTS

| WO | 0070362 A1   | 11/2000 |
| WO | 03073933 A1  | 9/2003  |

OTHER PUBLICATIONS

Klatt, D., et al.; Diagnosis of liver fibrosis by multifrequency viscoelastic parameter evaluation in magnetic resonance elastography; 2008; Proc. Intl. Soc. Mag. Reson. Med.; 16:83.

(Continued)

*Primary Examiner* — Elmer Chao

(57) ABSTRACT

A magnetic resonance elastography method includes application of mechanical oscillations with an oscillation period (T) to an object to be examined to generate mechanical waves in the object. A motion sensitive magnetic resonance acquisition sequence with repetition time $T_R$ issued to acquire magnetic resonance signals from the object. This acquisition sequence including application of one or more phase encoding steps within an individual repetition time. The repetition time times the number of phase encodings within one repetition time is not equal to an integer multiple of the oscillation period. Thus a magnetic resonance image of the wave pattern is reconstructed from the magnetic resonance signals assembled in a sample space spanned by the phase of the mechanical oscillation and the phase encoding.

6 Claims, 2 Drawing Sheets

(56) References Cited

OTHER PUBLICATIONS

Muthupillai, R., et al.; Spectrally-Selective Gradient Waveforms: Applications in MR Elastography; 1998; Proc. of the Society of Magnetic Resonance in Medicine; vol. 3:2180.

Rump, J., et al.; Fractional Encoding of Harmonic Motions in MR Elastography; 2007; MRM; 57:388-395.

Sack, I., et al.; MR Elastography of the Human Heart: Noninvasive Assessment of Myocardial Elasticity Changes by Shear Wave Amplitude Variations; 2009; MRM; 61:668-677.

Sinkus, R., et al.; High-resolution tensor MR elastography for breast tumour detection; 2000; Phys. Med. Biol.; 45:1649-1664.

Robert, B., et al.; Application of DENSE-MR-Elastography to the Human Heart; 2009; MRM; 62:9 pages.

Chen, J., et al.; Mechanical Shear Wave Induced by Piezoelectric Ceramics for Magnetic Resonance Elastography; 2005; IEEE Trans. on Engineering in Medicine and Biology; pp. 7020-7023.

Oida, T., et al.; Magnetic Resonance Elastography: in vivo Measurements of Elasticity for Human Tissue; 2004; IEEE Trans. on Informatics Research for Development of Knowledge Society Infrastructure; pp. 57-64.

\* cited by examiner

MAGNETIC RESONANCE ELASTOGRAPHY

FIELD OF THE INVENTION

The invention pertains to a magnetic resonance elastography method which includes application of mechanical oscillations with an oscillation period (T) to an object to be examined to generate mechanical waves in the object and application of a motion sensitive magnetic resonance acquisition sequence with repetition time $T_R$ to acquire magnetic resonance signals from the object.

BACKGROUND OF THE INVENTION

Such a magnetic resonance elastography method is known from the U.S. Pat. No. 5,592,085. In the known magnetic resonance elastography method, an oscillating stress is applied to the object being examined. An alternating magnetic gradient field is synchronised with the applied stress employed in an NMR imaging sequence to measure spin motion throughout the field of view.

SUMMARY OF THE INVENTION

An object of the invention is to provide a magnetic resonance elastography (MRE) method which allows the repetition time of the signal acquisition to be less subject to restrictions.

This object is achieved by a MRE method of the invention comprising application of mechanical oscillations with an oscillation period (T) to an object to be examined to generate mechanical waves in the object application of a motion sensitive magnetic resonance acquisition sequence with repetition time $T_R$ to acquire magnetic resonance signals from the object the acquisition sequence including application of one or more phase encoding steps within an individual repetition time, wherein the repetition time times the number of phase encodings within one repetition time is not equal to an integer multiple of the oscillation period and a magnetic resonance image of the wave pattern is reconstructed from the magnetic resonance signals assembled in a sample space spanned by the phase of the mechanical oscillation and the phase encoding.

Because the repetition time of the acquisition sequence is not restricted to an integer multiple of the oscillation period, the repetition time can be shortened, e.g. down to values of about 10 ms, or even as short as 2 ms. Thus, the present invention enables MRE to be performed with field-echo sequences. During oscillations being applied to the patient's body to generate mechanical shear waves, magnetic resonance signals are acquired. With every phase encoding profile, i.e. magnetic resonance signals having the same phase encoding and a range of read (or frequency) encodings, the phase of the mechanical oscillation is recorded. Thus, method of the invention assembles the magnetic resonance signals in the sample space spanned by the mechanical oscillation and the phase encodings. This allows the wave pattern due to the mechanical oscillations to be reconstructed.

These and other aspects of the invention will be further elaborated with reference to the embodiments defined in the dependent Claims.

In one aspect of the invention, the assembled magnetic resonance signals are acquired such that for individual phase encoding values(steps), magnetic resonance signals are acquired having several values of the phase of the mechanical oscillation. Notably, it appears that from three values of the phase of the mechanical oscillation for an individual phase-encoding a DC component and the phase and amplitude of a sine-wave with the oscillation period of the mechanical oscillation can be extracted. These values are then derived for a number of phase encodings. For each phase encoding step in the $k_y$ and/or $k_z$ directions in k-space for three or more values of the phase of the mechanical oscillation magnetic resonance signals are acquired and assembled in the sample space. Three values of the phase of the mechanical oscillation allow the DC component and the phase and amplitude of a sine-wave with the oscillation period of the mechanical oscillation to be extracted at the phase encoding at issue. When for more than three values of the phase of mechanical oscillation magnetic resonance signals are acquired, then the mechanical oscillations in the tissue can be more accurately reconstructed. On the other hand, when for more values of the phase there are magnetic resonance signals acquired, the a longer time to acquire all magnetic resonance signals is needed. For each of the phase encoding values from the assembled magnetic resonance signals for that phase encoding step, values for a DC component, for a dynamical amplitude for a phase of the mechanical waves are derived. The dynamical amplitude is the range of variation of the sine wave that represents the mechanical wave in the object. Thus, the magnetic resonance image of the wave pattern is produced from the phase and the dynamical amplitude of the mechanical oscillation of the tissue as a function of the phase encoding and the phase of the mechanical waves. The DC component is needed only to extract the dynamical amplitudes, which are themselves sufficient to reconstruct the wave pattern from. From the DC component an image of the anatomic region in which the wave pattern propagates can be reconstructed. Thus, this aspect of the invention allows the wavepattern to be shown in an image that also represents the stationary anatomy.

This approach relies on the frequency of the mechanical wave being known. In practice, the frequency of the mechanical wave through the tissue of the object, e.g. a patient to be examined is equal to the frequency of the mechanical oscillation that is applied. Further, the mechanical waves are in practice fairly approximated by a sine wave. Then, the wave pattern can be reconstructed by Fourier transformation of the acquired data. The phase encodings can be in one direction ($k_y$) or in two directions ($k_y$ and $k_z$) in k-space when a Cartesian scanning pattern in k-space is employed. The present invention can also be implemented with other approaches for scanning k-space, such as using radial or spiral scanning trajectories in k-space. As usual the phase encodings are imparted by application of temporary phase encoding gradient fields. Because the magnetic resonance signals are actually acquired for a large number of values of the phase of the mechanical oscillation, the wave pattern is reconstructed with a high accuracy.

In an alternative aspect of the invention, for a limited number, at least three, of values of the phase of the mechanical oscillation magnetic resonance signals are actually acquired. For additional values of the phase of the mechanical oscillation the values of the (read encoded) magnetic resonance signals are interpolated from the measured magnetic resonance signals. In this way a series of data is obtained that corresponds to successive values of the phase of the mechanical oscillation. This procedure is repeated for several values of the phase encoding. From the entire data set the wave pattern can be reconstructed. This interpolation approach requires less magnetic resonance signals to be actually acquired so that the acquisition time is shortened.

In a further aspect of the invention, the mechanical oscillations are generated simultaneously at several different oscillation frequencies. In this aspect of the invention the mechanical oscillations are generated by several actuators, which together create a broad spatial region in which mechanical waves are generated in the object to be examined. That is, each actuator generates mechanical waves in a region, and the regions in which the individual actuators generate the mechanical waves together form the broad spatial region. Preferably, the respective actuators operate at different frequencies. In this way interferences of the mechanical waves generated by different actuators are avoided. Notably, the use of different oscillation frequencies by different actuators avoids that contributions from different actuators destructively interfere causing regions that do not produce signal. When several (N) oscillation frequencies are employed, then for 2N+1 values of the phase of the mechanical oscillation magnetic resonance signals are needed for each phase encoding step. This enables to extract next to the DC offset, the dynamic amplitude and the phase of the mechanical oscillation at each of the oscillation frequencies.

Notably, the spatial region in which the mechanical oscillations are generated is broadened by placing the actuators that produce the mechanical oscillations at the different frequencies at different locations relative to the object, i.e. the patient to be examined.

The invention also pertains to a magnetic resonance examination system. The magnetic resonance examination system of the invention includes the actuator to apply the mechanical oscillations to the object, notably to the body of the patient to be examined so that mechanical waves are caused in the object. The magnetic resonance examination system is provided with an RF excitation system to apply RF pulses for the excitation of spins in the object. Also RF pulses may be applied for refocusing and/or inversion of the excited spins. A gradient system includes gradient coils to apply temporary magnetic gradient fields (gradient pulses) for the spatial encoding of the magnetic resonance signals. The gradient system also generates motion sensitising gradient pulses. The RF excitation system and the gradient system co-operate to generate the motion sensitive magnetic resonance acquisition sequences to generate the magnetic resonance signals from the object. The RF excitation system comprises RF antennae, e.g. in the form of RF coils. The gradient system includes gradient coils and gradient amplifiers. The gradient amplifiers feed an electric current to the gradient coils, which generate a gradient magnetic field. The RF coils often can be operated in an excitation as well as in a receiver mode. Thus the RF coils are often shared by the RF excitation system and the RF receiver system. The RF receiver system thus includes RF receiver antennae, i.e. RF receiver coils, or RF coils operated in receive mode. The RF receiver system also includes an electronic (digital) receiver system to receive the magnetic resonance signals that are picked-up by the RF receiver antennae. The receiver system also processes the magnetic resonance signals to render the magnetic resonance signals suitable to be applied to the reconstructor. The reconstructor reconstructs, e.g. by fast-Fourier transformation, the magnetic resonance image from the magnetic resonance signals. The RF excitation system the RF receiver system, the reconstructor and the actuator are controlled by a control unit, often in the form of a digital host computer. According to the invention, the control unit controls these components of the magnetic resonance signals to carry-out the method of the invention. Notably, the control unit arranges the to set the repetition time of the mechanical oscillations, set the repetition time of the motion sensitive magnetic resonance acquisition sequence time the number of phase encoding steps not equal to an integer multiple of the oscillation period. Further, the control unit causes the RF receiver system to assemble the magnetic resonance signals in a sample space spanned by the phase of the mechanical oscillation and the phase encoding. Finally, the reconstructor reconstructs the magnetic resonance image of the mechanical waves in the object to be examined from the assembled magnetic resonance signals.

The invention further relates to a computer programme. The computer programme of the invention can be provided on a data carrier such as a CD-rom disk or a USB memory stick, or the computer programme of the invention can be downloaded from a data network such as the world-wide web. When installed in the computer included in a magnetic resonance imaging system the magnetic resonance imaging system is enabled to operate according to the invention and enables that the magnetic resonance examination system is able to carry-out magnetic resonance elastography at a short repetition time.

These and other aspects of the invention will be elucidated with reference to the embodiments described hereinafter and with reference to the accompanying drawing wherein

DETAILED DESCRIPTION OF THE EMBODIMENTS

Figure 1:
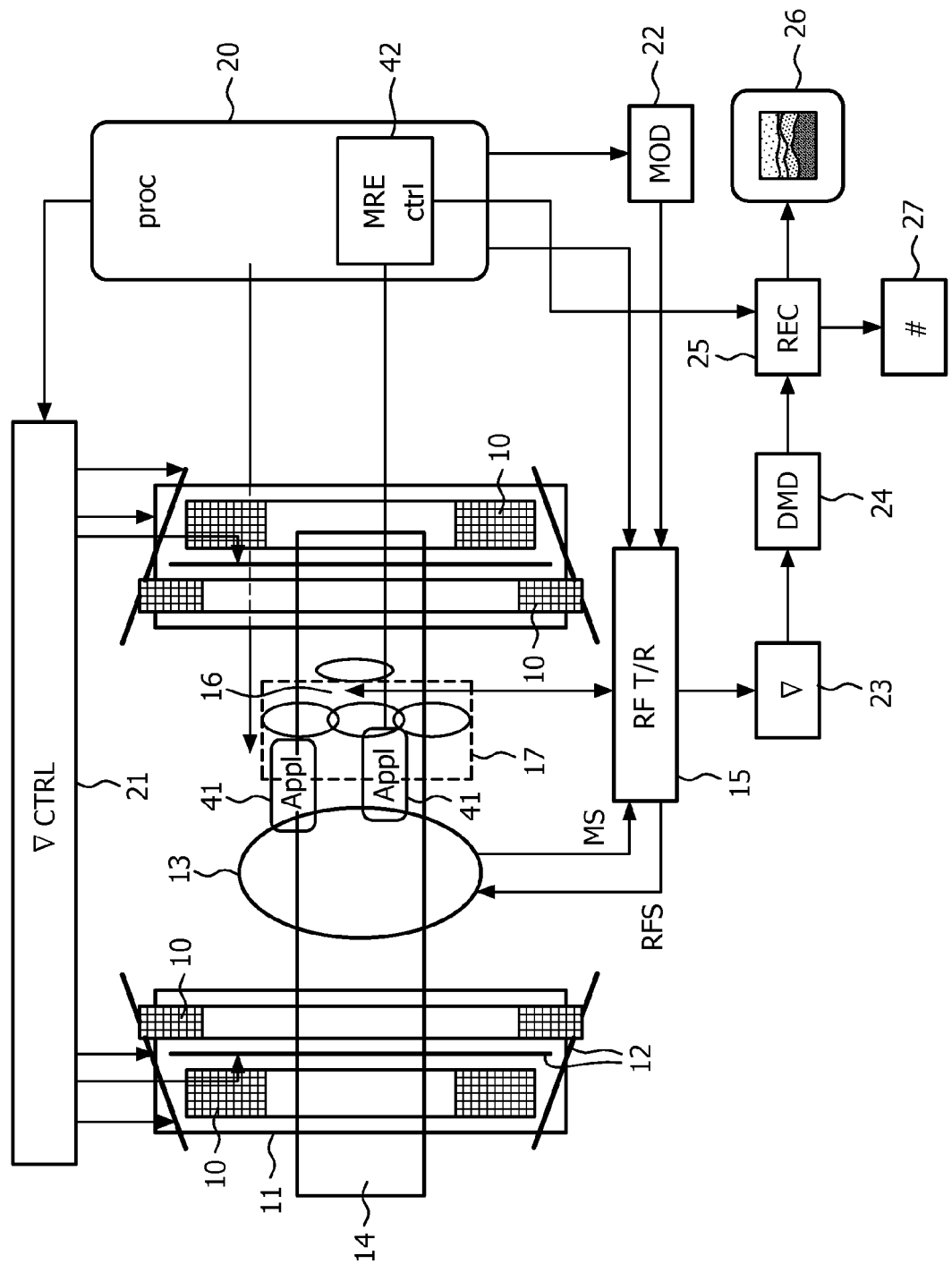
FIG. 1 shows diagrammatically a magnetic resonance imaging system in which the invention is used and FIG. 2 shows an example of the sampling of acquired data in the sample space.

The FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21, which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coils 16 are coupled to the transmission and receive circuit by way of a wireless link. Magnetic resonance signal data received by the surface coils 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. Alternatively, the amplified magnetic (RF) resonance signals are sampled by an ADC sampling unit which then applies the digitally sampled signals to the reconstructor. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The magnetic resonance examination system shown in FIG. 1 is in particular configured to perform magnetic resonance elastography (MRE). The magnetic resonance examination system is provided with an actuators 41 that applies mechanical oscillations to the body of the patient to be examined, so that mechanical waves are generated in the patient's body. The embodiment shown in FIG. 1 has two actuators 41 operating at different oscillation frequencies. These two actuators generate a broad spatial region into which mechanical waves are generated. Because each actuator operates on its own narrow frequency band in the region of a few hundred Hertz, destructive interferences in the broad spatial region are avoided. Further, the control unit 20 includes an MRE module 42 which controls the MRE aspects of the magnetic resonance examination system. Notably, the MRE module 42 controls the actuator 41. Further the MRE module 42 is coupled to the reconstructor 23 to apply the phase of the mechanical oscillation applied to the patient's body to the reconstructor. The reconstructor receives the (demodulated) magnetic resonance signals as explained as well as the phase of the mechanical oscillation. According to this implementation of the invention, the reconstructor is programmed to acquire the magnetic resonance signals for each phase encoding step for various values of the phase of the mechanical oscillation. Further, the reconstructor includes arithmetic functions to compute the DC component, the dynamic amplitude and phase of the mechanical waves generated in the patient's body. The MRE module 42 also communicates the frequencies of the oscillation of each actuator 41. This frequency is taken into account by the reconstructor for the reconstruction of the wave pattern in the patient's body.

More generally, a plurality of N actuators can be employed. That is, the patient's body is surrounded by a multiplicity of N actuators. These are numbered $\upsilon=1, \ldots, N$.

All these actuators induce vibrations into the body, each actuator having a slightly different vibration frequency represented by $\omega_\upsilon$.

Each of these vibrations, i.e. the mechanical oscillations, causes, for every position $\bar{\rho}$ in space, a displacement of amplitude $\alpha_\upsilon(\bar{\rho})$ and phase $\phi_\upsilon(\bar{\rho})$.

The aim of the measurement and reconstruction (details are to follow) is to reconstruct $\alpha_\upsilon(\bar{\rho})$ and $\phi_\upsilon(\bar{\rho})$.

The measurement is designed to acquire for each "profile" 0 of k-space, a multitude of measurements, while avoiding all synchronicity to any of the actuator-frequencies and possibly even by some randomness in the repetition time TR. "Profile" 0 stands for any predefined subset of k-space, but most commonly this refers to a line of constant $k_y$ and $k_z$. For simplicity, the sequel is described with that "most common" 0 (i.e. Cartesian) scheme in mind. Take that every profile of given $k_y$ and $k_z$, is measured in total M times (actually, M might differ per profile, but this is not crucial here). These acquisitions will occur at times $t_{k_y,k_z,u}$, with $u=1, \ldots, M$ (times are relative to any arbitrarily chosen reference moment in time). Preferably, M>2N+1.

The task of reconstruction is to calculate $\alpha_\upsilon(\bar{\rho})$ and, more importantly, $\phi_\upsilon(\bar{\rho})$, from all of the data in the profiles with phase encoding $k_y$ and $k_z$ that are measured at time $t_{k_y,k_z,u}$.

The displacements at any moment of time at any position in space is given by the sum of displacements induced by all the actuators, i.e. $\Sigma^N_{\upsilon=1}\alpha_\upsilon(\bar{\rho})\sin(\omega_\upsilon t+\phi_\upsilon(\bar{\rho}))$. The contribution of that location to the total signal can be expressed as $$p(\bar{\rho}) \cdot a_0(\bar{\rho}) + S \cdot p(\bar{\rho}) \cdot \sum_{v=1}^{N} a_v(\bar{\rho}) \sin(\omega_v t_u + \varphi_v(\bar{\rho})).$$

Here, $\rho(\bar{\rho})$ denotes the magnetization density; $\alpha_0(\bar{\rho})$ is a factor that expresses the local (sequence-dependent and may be unwanted) contribution of the static signal to the overall signal, and S is the (presumably well-predictable and constant) sensitivity of the signal to velocity; this is of course a property of the sequence.

The measured data can be expressed as $$m_{k_y,k_z,u}(k_x) = \mathcal{F}\left\{p(\bar{\rho}) \cdot a_0(\bar{\rho}) + S \cdot p(\bar{\rho}) \cdot \sum_{v=1}^{N} a_v(\bar{\rho}) \sin(\omega_v t_u + \varphi_v(\bar{\rho}))\right\}_{k_y,k_z}(k_x)$$

Here, $\mathcal{F}$ stands for Fourier transform.

To elaborate this further, a few shorthand symbols are introduced:

$$x_0(\bar{\rho}) = p(\bar{\rho}) \cdot a_0(\bar{\rho})$$

$$x_{v+}(\bar{\rho}) = \frac{S \cdot p(\bar{\rho}) \cdot a_v(\bar{\rho})}{2i} \exp(i\varphi_v(\bar{\rho}))$$

$$x_{v-}(\bar{\rho}) = \frac{S \cdot p(\bar{\rho}) \cdot a_v(\bar{\rho})}{2i} \exp(-i\varphi_v(\bar{\rho}))$$

$$w_{uv+} = \frac{\exp(i\omega_v t_u)}{2i}$$

$$w_{uv-} = \frac{\exp(-i\omega_v t_u)}{2i}$$

On top of that, the sinus is expanded in exponentials, $\sin(\alpha)=(\exp(i\alpha)-\exp(-i\alpha))/2i$, we obtain $$m_{k_y,k_z,u}(k_x) = \mathcal{F}\left\{x_0(\bar{\rho}) + \sum_{v=1}^{N}(w_{uv+}x_{v+}(\bar{\rho}) + w_{uv-}x_{v-}(\bar{\rho}))\right\}_{k_y,k_z}(k_x)$$

Now name $\xi$ to be the Fourier transform of x, e.g., $\xi_0(\bar{k})= \mathcal{F}\{x_0(\bar{\rho})\}$. Since the Fourier transform is linear, we can also write $$m_u(k_x) = \xi_0(k_x) + \sum_{v=1}^{N}(w_{uv+}\xi_{v+}(k_x) + w_{uv-}\xi_{v-}(k_x))$$

The subscripts $k_y, k_z$ have been omitted for brevity. By the way, the values of $w_{uv}$ differ per profile, but this does not change the discourse.

What we see above is a linear set of equations; a set of M equations with 2N+1 unknowns. This can be solved for $\xi$. Fourier-transforming this delivers sets of data $x_0(\bar{\rho})$, $x_{v+}(\bar{\rho})$ and $x_{v-}(\bar{\rho})$. These, again (recalling what these shortcuts mean) allow to calculate the values of $p(\bar{\rho})\alpha_0(\bar{\rho})$, of $p(\bar{\rho})\alpha_v(\bar{\rho})$ and of $\phi_v(\bar{\rho})$.

This allows to calculate, for every position within the measured space, the amplitude and the phase of the vibration caused by any of the actuators.

In principle, the information of any of the actuators is sufficient to estimate the properties of the tissue at any location; however, the results of this calculation could be rather inaccurate if an actuator is distant from the region under consideration.

If we calculate the tissue properties using the data of each actuator separately, we can later re-combine the data by appropriate weighting; "appropriate" means that, for any location, we will particularly take into account the data of those actuators that produced the strongest vibration in that location.

Figure 2:
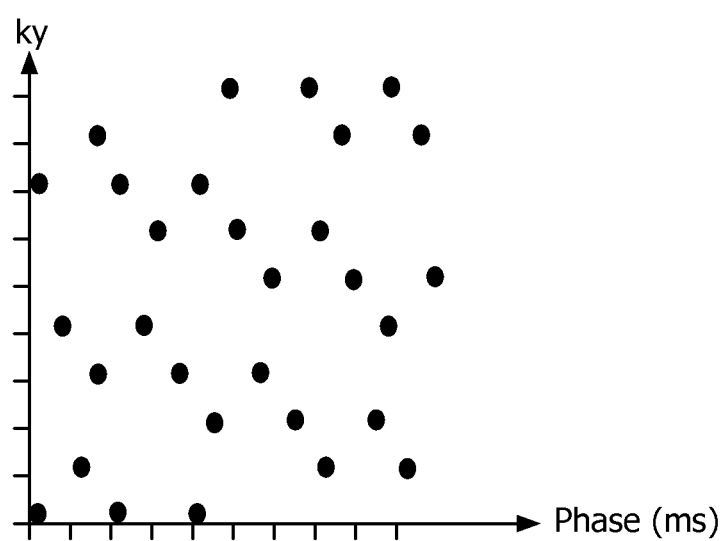

FIG. 2 shows an example of the sampling of acquired data in the sample space. As is shown in FIG. 2 the sample space is spanned by the axes of the phase of the mechanical oscillation ('phase') and the phase encoding direction ($k_y$). The example shows only ten values of the phase-encoding, but in practice a much larger number, e.g. 256 values can be used. In the example shown the repetition time $T_R$ of the field echo acquisition sequence is 7.2 ms and the actuator operates at 100 Hz, i.e. the actuator has a periodicity of 10 ms. The phase of the oscillation is specified in terms of time elapsed from start of the actuator, modulo 10 ms (the period of the oscillation). Thus for every $k_y$-line the sampling advances 7.2 ms along the phase axis. Thus for $k_y$=0,1,2,3,4 samples at positions at 0 ms, 7.2 ms, 14.4−10=4.4 ms, 21.6—20=1.6 ms and 28.8−20=8.8 ms are measured. When the measurement is continued for $30T_R$(30*7.2=216 ms) the sample space coverage as shown in FIG. 2 is formed. It is noted that the present invention allows the acquisition time to be reduced even further. For example when the actuator operates at 400 Hz, the RF excitation will last about 0.9 ms and the read-out will take about 1 ms, so that the repetition time is shortened to about less than 2 ms., as seen from FIG. 2, for every phase encoding value of ky, three sampling points are measured in the sampling space. Thus, the magnetic resonance signals are arranged in the sample space. In this example, the re-binning is automatically incorporated in the acquisition process. Alternatively, the phase encoding and phase of the actuator may be recorded/controlled separately and the magnetic resonance signals in the sample space such that for individual phase encoding steps (values) there are magnetic resonance signals available for at least three phases. Then, for each phase encoding value ky, the DC component, the phase and dynamic amplitude are computed by the arithmetic function on the basis of the frequency of the actuator that was communicated by the MRE module 42.

The invention claimed is:

1. A magnetic resonance elastography method comprising:
    applying mechanical oscillations with an oscillation period (T) to an object to be examined to generate mechanical waves in the object;
    applying a motion sensitive magnetic resonance acquisition sequence with repetition time $T_R$ to acquire magnetic resonance signals from the object, the acquisition sequence including application of one or more phase encoding steps within an individual repetition time,
    wherein the repetition time is independent of the oscillation period, and
    wherein a magnetic resonance image of a wave pattern of the generated mechanical waves in the object is reconstructed from the magnetic resonance signals assembled in a sample space spanned by a phase of the mechanical oscillations and a phase encoding.

2. The magnetic resonance elastography method as claimed in claim 1, wherein:
    for each phase encoding, magnetic resonance signals are acquired for at least three different values of the phase of the mechanical oscillation, enabling extraction of a DC component and phase and amplitude of a sine-wave with the oscillation period of the mechanical oscillation at the phase encoding, and an image of the wave pattern in the object is reconstructed based on at least the DC component, and the phase and amplitude of the mechanical wave.

3. The magnetic resonance elastography method as claimed in claim 1, further comprising:

interpolating values of the magnetic resonance signals in the sample space spanned by the phase of the mechanical oscillation and the phase encoding to provide interpolated data at additional values of the phase of the mechanical oscillation, wherein the magnetic resonance image of the wave pattern is reconstructed from the interpolated data, in addition to the assembled magnetic resonance signals.

4. The magnetic resonance elastography method as claimed in claim 1, wherein the mechanical oscillations are generated in the object at multiple oscillation frequencies simultaneously, wherein the repetition time is independent of the oscillation periods corresponding to the multiple oscillation frequencies.

5. A magnetic resonance examination system, comprising:

an actuator configured to apply mechanical oscillations to an object to be examined for generating mechanical waves in the object;

an RF excitation system and a gradient system configured to apply a motion sensitive magnetic resonance acquisition sequence, the motion sensitive magnetic resonance acquisition sequence including a plurality of phase encoding steps;

an RF receiver system configured to receive magnetic resonance signals generated in the magnetic resonance acquisition sequence;

a reconstructor configured to reconstruct a magnetic resonance image from the received magnetic resonance signals assembled in a sample space spanned by a phase of the mechanical oscillations and a phase encoding; and a control unit configured to control operations of the RF excitation system, the gradient system, the actuator and the reconstructor, to set a repetition time of the mechanical oscillations, and to set a repetition time of the motion sensitive magnetic resonance acquisition sequence time, the repetition time of the motion sensitive magnetic resonance acquisition sequence time being independent of an oscillation period of the mechanical oscillations, wherein the reconstructor is further configured to reconstruct the magnetic resonance image of the mechanical waves from the assembled magnetic resonance signals.

6. A computer readable medium containing instructions, executable by a computer processor, for performing magnetic resonance elastography, the computer readable medium comprising:

mechanical oscillation application code for applying mechanical oscillations with an oscillation period (T) to an object to be examined to generate mechanical waves in the object;

magnetic resonance acquisition sequence application code for applying a motion sensitive magnetic resonance acquisition sequence with repetition time $T_R$ to acquire magnetic resonance signals from the object, the acquisition sequence including application of one or more phase encoding steps within an individual repetition time, wherein the repetition time is independent of the oscillation period, and wherein a magnetic resonance image of a wave pattern of the generated mechanical waves in the object is reconstructed from the magnetic resonance signals assembled in a sample space spanned by a phase of the mechanical oscillation and the phase encoding.

* * * * *